United States Patent

Goruganthu et al.

[11] Patent Number: 6,069,366
[45] Date of Patent: May 30, 2000

[54] ENDPOINT DETECTION FOR THINNING OF SILICON OF A FLIP CHIP BONDED INTEGRATED CIRCUIT

[75] Inventors: Rama R. Goruganthu; Victoria J. Bruce, both of Austin; Glen Gilfeather, Del Valle, all of Tex.

[73] Assignee: Advanced Micro Devices, Inc., Sunnyvale, Calif.

[21] Appl. No.: 09/050,531

[22] Filed: Mar. 30, 1998

[51] Int. Cl.[7] .................................................. G01N 21/86
[52] U.S. Cl. ................................. 250/559.27; 250/559.4; 219/121.4
[58] Field of Search ........................... 250/559.27, 559.4, 250/559.22; 356/381, 376; 216/89, 87; 219/121.19, 121.37, 121.62, 121.4

[56] References Cited

U.S. PATENT DOCUMENTS

| | | | |
|---|---|---|---|
| 5,254,830 | 10/1993 | Zarowin et al. | 219/121.43 |
| 5,430,305 | 7/1995 | Cole et al. | 250/559.07 |
| 5,667,629 | 9/1997 | Pan et al. | 216/86 |

Primary Examiner—Que T. Le

[57] ABSTRACT

A system for determining the endpoint associated with removing silicon from the backside of a flip chip type die includes a tool for removing silicon and a light source for directing light to the backside of the die. An electrical measuring apparatus, such as a voltmeter, ammeter or oscilloscope, is attached across the output pins of a package to which the die is attached. The light or ions directed toward the backside of the die induce a current in the devices formed in the semiconductor. The value of the current or voltage output depends on the thickness of material between the endpoint on the backside of the die and the devices in the epitaxial layer of the die. The induced signal can be monitored to determine the thickness. Silicon can be removed globally until the thickness is reasonable such that a local thinning tool can be used to remove silicon to get to the area of interest in a reasonable amount of time. The induced current can be monitored during local thinning. A viewing mechanism such as infrared microscopy can be used to locate the specific device or devices of interest in the epitaxial layer of the die. The viewing mechanism is also used to determine where localized thinning will occur.

29 Claims, 7 Drawing Sheets

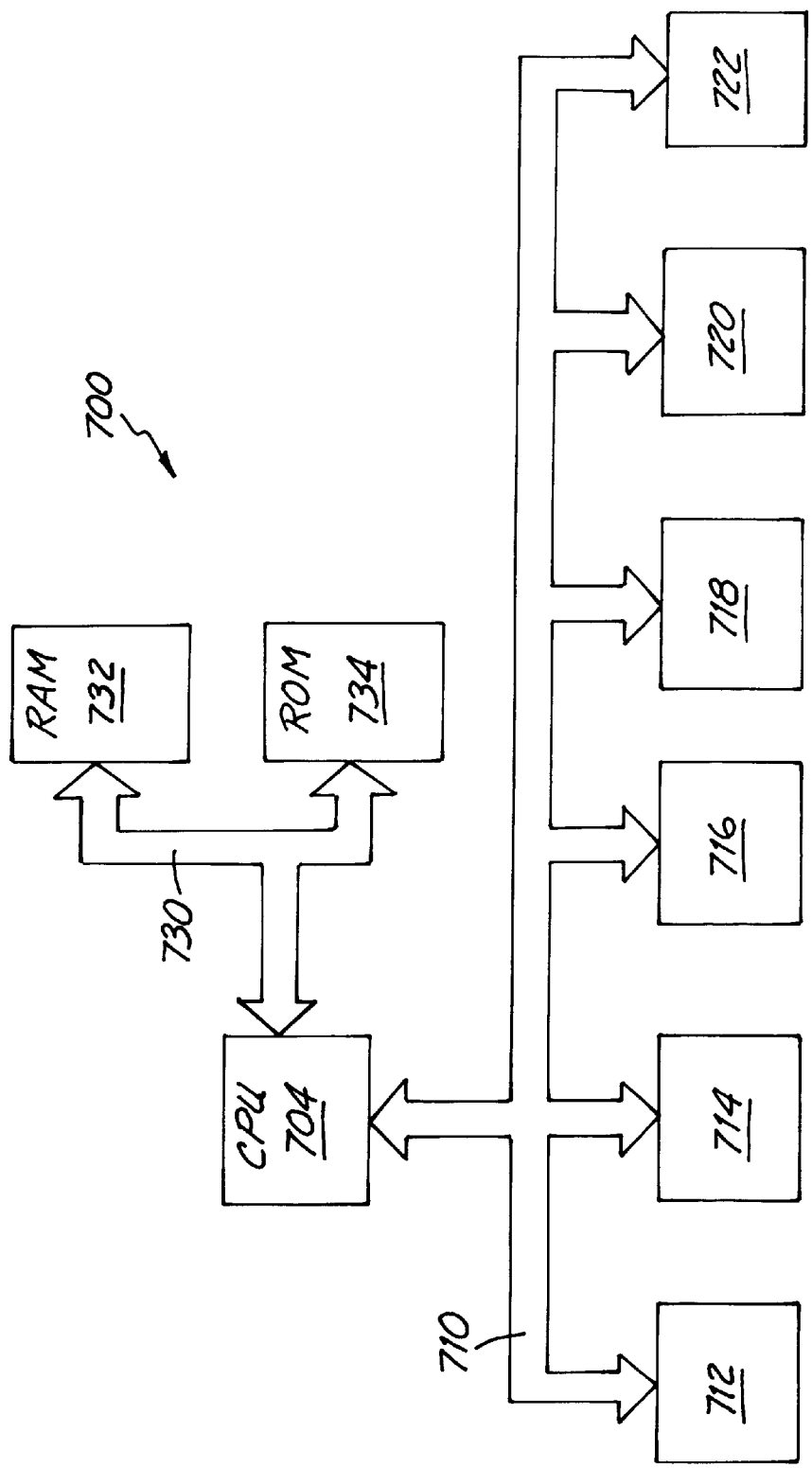

ENDPOINT DETECTION FOR THINNING OF SILICON OF A FLIP CHIP BONDED INTEGRATED CIRCUIT

FIELD OF THE INVENTION

The invention relates to semiconductor device assemblies, and more particularly to techniques for analyzing and debugging circuitry associated with a flip chip bonded integrated circuit.

BACKGROUND OF THE INVENTION

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

In the past the die and package were first attached and then the electrical connections from the die to the package were made by wire bonding. The wire bonding procedure is simple in concept. A thin (0.7 to 1.0 mil) wire is first bonded to the chip bonding pad and spanned to the inner lead of the package lead frame. The third action was to bond the wire to the inner lead. Lastly, the wire is clipped and the entire process repeated at the next bonding pad. While simple in concept and procedure, wire bonding was critical because of the precise wire placement and electrical contact requirements. In addition to accurate placement, each and every wire must make a good electrical contact at both ends, span between the pad and the inner lead in a prescribed loop without kinks, and be at a safe distance from neighboring lead wires. Wire loops in these packages are 8 to 12 mils, while those of ultrathin packages are 4 to 5 mils. Wire bonding has been done with either gold or aluminum wires. Both types of wire are highly conductive and ductile enough to withstand deformation during the bonding steps and remain strong and reliable.

Wire bonding between a die and a package has several problems. One problem is that a wire bond attachment to a die limits the number of pads and placement of the pads on the die. In addition, minimum height limits are imposed by the required wire loops. Another problem is that there is a chance of electrical performance problems or shorting if the wires come too close to each other. The wire bonds also require two bonds and must be placed one-by-one and there are resistances associated with each bond. The wires are also relatively long and thus could contribute significantly to lead inductance and capacitance. This could limit acceptable signal speed in the system.

To increase the number of pad sites available for a die and to address the problems stated above and other problems, a different chip packaging technique called controlled collapse chip connection or flip chip packaging is being adopted. In this technology, the bonding pads are provided with metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads and soldered. As a result, the dies are commonly called flip chips in the industry. Each bump connects to a corresponding package inner lead. The packages which result are lower profile and have lower electrical resistance and a shortened electrical path. The output terminals of the package may be ball-shaped conductive bump contacts (usually solder, or other similar conductive material) are typically disposed in a rectangular array. These packages are occasionally referred to as "Ball Grid Array" (BGA). Alternatively, the output terminals of the package may be pins and such a package is commonly known as pin grid array (PGA) package.

Alternatively, the output terminals of the package may be pins and such a package is commonly known as pin grid array (PGA) package.

Once the die is attached to the package the backside portion of the die remains exposed. The transistors and other circuitry are generally formed in a very thin epitaxially grown silicon layer on a single crystal silicon wafer of which the die is singulated from. The side of the die including the epitaxial layer containing the transistors, and the other active circuitry is often referred to as the circuit side of the die or front side of the die. The circuit side of the die is positioned very near the package. The circuit side opposes the backside of the die. Between the backside and the circuit side of the die is single crystalline silicon. The positioning of the circuit side provides many of the advantages of the flip chip. However, in some instances the orientation of the die with the circuit side face down on a substrate may be a disadvantage or present new challenges. When a circuit fails or when it is necessary to modify a particular chip, access to the transistors and circuitry near the circuit side is obtained only from the backside of the chip. This is challenging since the transistors are in a very thin layer (about 10 $\mu$m) of silicon buried under the bulk silicon (>500 $\mu$m). Thus, the circuit side of the flip chip die is not visible or accessible for viewing using optical or scanning electron microscopy.

Although the circuit of the integrated circuit (IC) is buried under the bulk silicon, infrared (IR) microscopy is capable of imaging the circuit because silicon is relatively transparent in these wavelengths of the radiation. However, because of the absorption losses of IR radiation in silicon, it is generally required to thin the die to less than 100 microns in order to view the circuit using IR microscopy. On a die that is 725 microns thick, this means removing at least 625 microns of silicon before IR microscopy can be used. Thinning the die for failure analysis of a flip chip bonded IC is usually accomplished in two or three steps. First, the die is thinned across the whole die surface. This is also referred to as global thinning. Global thinning is done to allow viewing of the active circuit from the backside of the die using IR microscopy. Mechanical polishing is one method for global thinning.

Once an area is identified using IR microscopy as an area of interest and it is determined that access is needed to a particular area of the circuit, local thinning techniques are used to thin an area smaller than the die size. Laser microchemical etching of silicon is one method of local thinning. One method for laser microchemical etching of silicon is accomplished by focussing a laser beam on the backside of the silicon surface to cause local melting of silicon in the presence of chlorine gas. The molten silicon reacts very rapidly with chlorine and forms silicon tetrachloride gas, which leaves the molten (reaction) zone. This is a silicon removal process used on the 9850 SiliconEtcher™ tool by Revise, Inc. (Burlington, Mass). This laser process is suitable for both local and global thinning by scanning the laser over a part or whole surface of the die.

Sometimes it is necessary for failure analysis, or for design debug, to make electrical contact and probe certain nodes in the circuit that is on the circuit side or front side of the die. This is generally done by milling through the die to access the node, or milling to the node and subsequently depositing a metal to electrically access the node. These access holes need to have high aspect rations. For design debug, it is desirable to have the capability of cutting the interconnect lines and rerouting of the interconnect lines. Milling through silicon with fairly high aspect ratio trenches is slow and is almost impractical for silicon thickness greater than 10 microns. For these reasons, it is necessary to have a method and apparatus which will provide for controlled thinning flip chip bonded IC devices to less than 10 micron thickness. It is also necessary to have a method where the thickness of the silicon can be determined with sufficient accuracy to avoid milling off the node to which access is being sought. Milling off the node could often jeopardize further device analysis.

The need for a method for accurately determining the thickness of the silicon is not eliminated by an approach where the backside is thinned to a distance away from the package to which the die is attached. Various parts tolerances do not allow for such a simple solution to approaching the circuit side of the die from the back side of the die. One tolerance issue revolves around keeping the height of solder ball contacts on the die substantially uniform for every packaged device of a particular type. Even though the solder ball contacts have a tolerance requirement, when the solder is reflowed to attach the die to a package, the amount of change in height due to solder reflow can vary by several microns. The thickness of the die between the circuit side and backside is also subject to tolerance differences. Since the thickness of the starting silicon wafer is a non-essential parameter for making a functioning die, typically the die thickness is not known to an accurate level. For instance, a typical die for a microprocessor may have a die thickness of 725±15 microns. The end result is tolerance stacking due to the tolerances for the size of the solder balls, the height at which the die is attached and the thickness of the die. These tolerances stack up such that there can be tens of microns of difference in height from the top surface of the package to the top surface of the die among different packaged devices. Although this does not sound like much of a tolerance problem, it should be noted that the epitaxial layer is only between 2 and 10 microns thick. As a result, the thickness of the remaining silicon of a trench cannot be gauged by measuring from the top surface of the package to the bottom of the trench. Stack up of the tolerances of the various parts precludes simply "measuring up" from the package to which the die is attached to determine where the epitaxial layer containing the transistors begins. Simply put, such an approach is not accurate enough to prevent ruining the circuitry or transistors that must be analyzed or debugged. Once the circuitry or transistors are ruined, analysis or debugging is impossible.

Therefore, the introduction of flip chip technology requires a method and apparatus for determining the thickness of silicon between a portion of the active circuitry near the circuit side of the die and the backside of the die. This is necessary to eliminate any guesswork as to the location of the circuitry while the backside of a die is being removed. If this guesswork is eliminated, it facilitates failure analysis and debugging of the circuitry associated with a particular integrated circuit. Furthermore, when the position of the circuitry is known or can be determined from the backside removal of the silicon, getting to the circuitry can be accomplished in less amount of time. Therefore, to facilitate more effective and efficient backside thinning processes, a measurement method and apparatus sensitive to the thickness of the remaining silicon is needed. Such a method and apparatus would be useful and essential for controlled backside thinning of silicon.

SUMMARY OF THE INVENTION

A system for determining the endpoint associated with removing silicon from the backside of a flip chip bonded die includes a tool for removing silicon and a light source for directing light to the backside of the die. An electrical measuring apparatus, such as a voltmeter, ammeter or oscilloscope, is attached across the output pins of a package to which the die is attached. The light directed toward the backside of the die induces a current in the devices formed in the semiconductor. The value of the current or voltage output depends on the thickness of material between the backside of the die where light is illuminated and the devices in the epitaxial layer of the die. The induced signal can be monitored to determine the thickness. Silicon can be removed globally until the thickness is reasonable such that a local thinning tool can be used to remove silicon to get to the area of interest in a reasonable amount of time. The induced current can be monitored during local thinning. A viewing mechanism such as infrared microscopy can be used to locate the specific device or devices of interest in the epitaxial layer of the die. The viewing mechanism is also used to determine where localized thinning will occur.

A method for using the system includes monitoring the thickness of the backside until a desired thickness is achieved. After global thinning, the viewing mechanism is used to select the area on the backside of the die for localized thinning. The induced signal is monitored during the thinning process until it reaches a specific value associated with a small distance between the surface resulting from the thinning process and the device of interest.

Advantageously, using this system and method provides for a much faster thinning of the backside to the area of interest since the distance between the backside of the chip or die and the circuit or device of interest is known. Since the distance between the backside of the die and the circuit device is also known, it is much less likely that the device of interest will be ruined as a result of thinning. The guess work formally associated with the thinning process is eliminated. This increases the effectiveness of debugging the circuit in a die or determining the failure of a particular die. In addition, this system and process can be done under control of a microprocessor or information handling system.

BRIEF DESCRIPTION OF THE DRAWINGS

The following detailed description of the preferred embodiments can best be understood when read in conjunction with the following drawings, in which:

FIG. 7 is a schematic of an information handling system.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
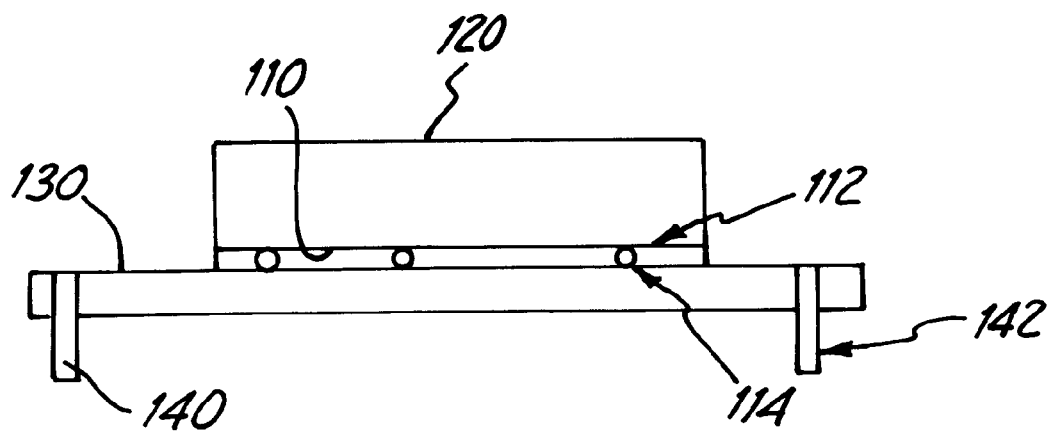
FIG. 1 shows a side view of a flip chip packaged integrated circuit.

FIG. 1 shows a side view of a flip chip type die 100 having a circuit side 110 and a backside 120. The circuit side 110 includes a number of circuit devices formed near the circuit side in a portion of the die known as the epitaxial layer 112. The epitaxial layer 112 has a thickness in the range of 1 to 15 microns. A plurality of solder bumps 114 are made on the circuit side 110. The solder bumps 114 are the inputs and outputs to the circuitry associated with the die 100. The flip chip type die 100 is attached to a surface 130, such as a package for a flip chip via the solder bumps on the die 100. The surface 130 includes pads which are arranged to correspond to the pattern of solder bumps on the die 100. The pads are electrically connected to circuitry within the package and then to pins, such as pin 140 and pin 142 shown in FIG. 1. Pin 140 is VDD for the package and pin 142 is VSS for the package.

Figure 2:
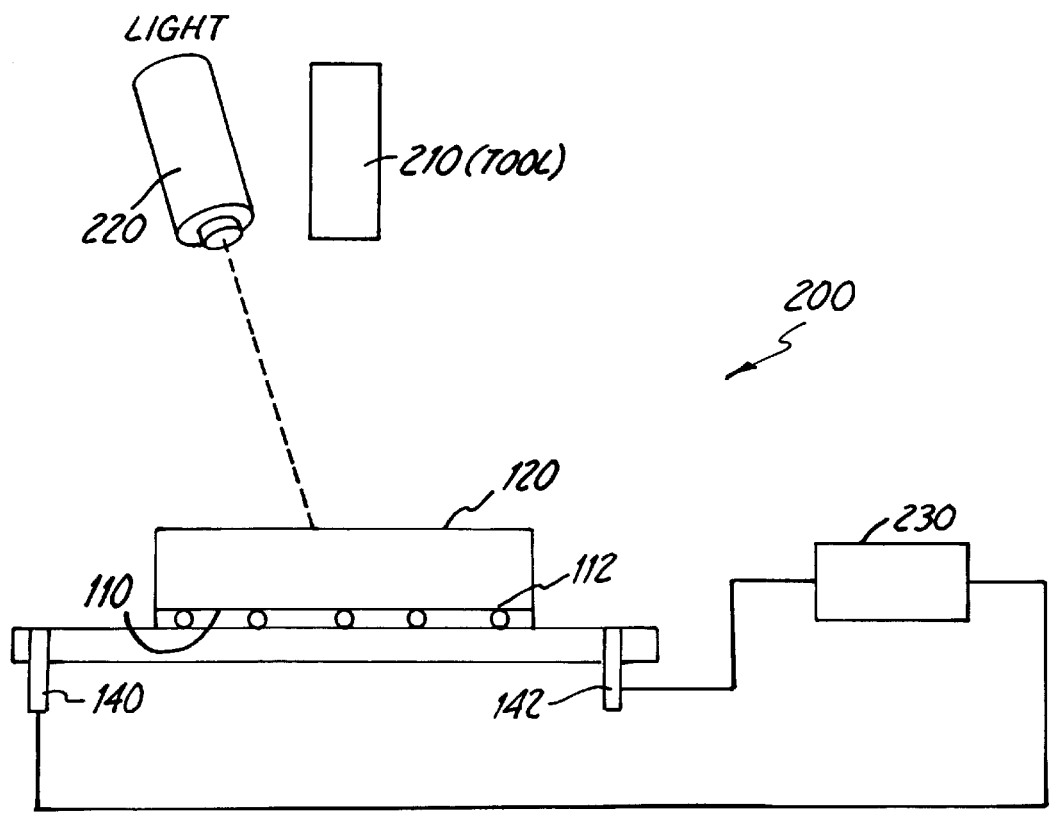
FIG. 2 shows a schematic view of a system for determining the distance to the active circuit of a flip chip attached to a substrate.

FIG. 2 shows a schematic view of a system 200 for determining the distance to the active circuit of a flip chip type die 100 attached to a substrate or surface 130. The system includes a tool 210 for removing porions of the die. The tool 210 can be a used to globally thin the die, such as a polishing device or grinding device which removes silicon across the entire backside 120 surface. The tool 210 can also be used to locally thin a portion of the die 100. Localized thinning is done on an area of the backside 120 which is less than the entire area of the backside 120. Typically, the tool 210 is a combination of tools, one of which may do global thinning and another that can do localized thinning of the die 100. Another typical tool is one that can perform both the localized and global thinning.

Preferably, for device failure analysis of a bonded flip chip type die 100, the die is thinned across the whole die surface or globally thinned using a mechanical polishing device, such as a single platen calibrated polishing machine from Allied High Tech Products, Inc. of California. The global thinning is followed by local thinning in the area of interest on the die 100. The local thinning is accomplished by laser microchemical etching of silicon. Laser microchemical etching is a method where a laser beam is focused on the backside 130 silicon surface to cause local melting of silicon in the presence of chlorine gas. The molten silicon reacts very rapidly with chlorine and forms silicon tetrachloride gas, and leaves the molten (reaction) zone. This is a silicon removal process used on the 9850 SiliconEtcher™ by Revise, Inc. (Burlington, Mass.). This laser process is suitable for both local and global thinning by scanning the laser over a part or whole surface of the backside 130 of the flip chip type die 100.

Chemical assisted ion etching is a method for silicon removal used in other tools. For example, chemical assisted ion etching is used in a Focused Ion Beam (FIB) tool made by Micrion Inc. of Peabody, Massachusetts. In this process, local heating on the flip chip type die 100 due to focused ion beam accelerates etching of silicon in an environment having xenon difluoride. The xenon difluoride is continuously introduced to the die 100. The reaction produces silicon fluoride and xenon gases which are removed by pumping them out at process temperature. This of course removes silicon from the die 100. Of course, there are numerous other methods for removing silicon such as reactive ion etching.

The system 200 for determining the distance to the active circuit of a flip chip type die 100 attached to a substrate or surface 130 also includes a light source 220 which can be a broad spectrum type of light which produces a range of light frequencies or can be a laser which generally produces one wavelength of light. In other words, the light source 220 can be broad beam and include many different wavelengths of light or the light source can be monochromatic which produces light having a single wavelength. The light source 220 is directed at the backside 120 surface of the die 100 when the distance to the circuitry is desired. The system 200 for determining the distance to the active circuit of a flip chip type die 100 attached to a substrate or surface 130 also includes a device 230 for measuring electrical signals between the pins 240 or 242. As shown in the system 200 for determining the distance to the active circuit of a flip chip type die 100 attached to a substrate or surface 130 the device 230 for measuring electrical signals is attached to pin 142 and pin 140. The device 230 for measuring electrical signals is a transimpedance amplifier used to measure current. This amplifier converts current to voltage. The voltage output from the transimpedance amplifier is measured and recorded as OBIC signal. The transimpedance amplifier used in this application will not introduce a significant bias voltage across the VSS and VDD pins. However, if this bias voltage exceeds the threshold voltage for conduction of the p-n junctions, the measured current will be a sum of the OBIC component and diode (junction) current. Hence, the measured signal is not completely reflective of the OBIC signal.

The device 230 could also be an oscilloscope using its input impedance to convert current to voltage. Similarly, the OBIC current can be determined by measuring the voltage dropped across a known resistor using a voltmeter. The strength of the output at the pins is indicative of the distance between the circuitry or devices found in the epitaxial layer near the circuit side 110 of the die 100 and the backside 120 of the die 100.

A CMOS or bipolar IC includes several p-n junctions. When these junctions are exposed to light of photon energy higher than the band gap of silicon (1.1 eV), a photo current is generated. This is commonly referred to as an Optical Beam Induced Current ("OBIC"). The OBIC is measured across the VSS pin 142 and VDD pin 140 on the package of the IC while exposing the die to light from the light source 220. The light source used was a green light generated at a preset power level from an argon-ion laser.

If the silicon thickness between the backside 120 of the die 100 and the devices or circuitry in the epitaxial layer 112 is greater than about 100 microns, the light beam will generate electron hole pairs near the surface of the backside 120 and very far from the depletion region of the junctions in specific devices in the epitaxial layer of die 100. In this case, very few of the carriers can diffuse to the source and drain regions to generate OBIC signal at the VSS pin 142 or the VDD pin 140. To a great extent, the carriers recombine before they reach the junction region. Hence the efficiency for generating photo current is low and little or no OBIC signal is produced at the pin 142.

As the silicon is further thinned, sufficient intensity of the light beam can penetrate the thickness of silicon to generate electron hole pairs in the depletion region of the junction or very close to the depletion region of specific devices associated with the circuitry found in the epitaxial layer 112 of the die 100. In this case, the carriers diffuse to the source and drain regions of one or more devices in the epitaxial region to generate photo current and the OBIC at the pins 142 and 140.

Figure 3:
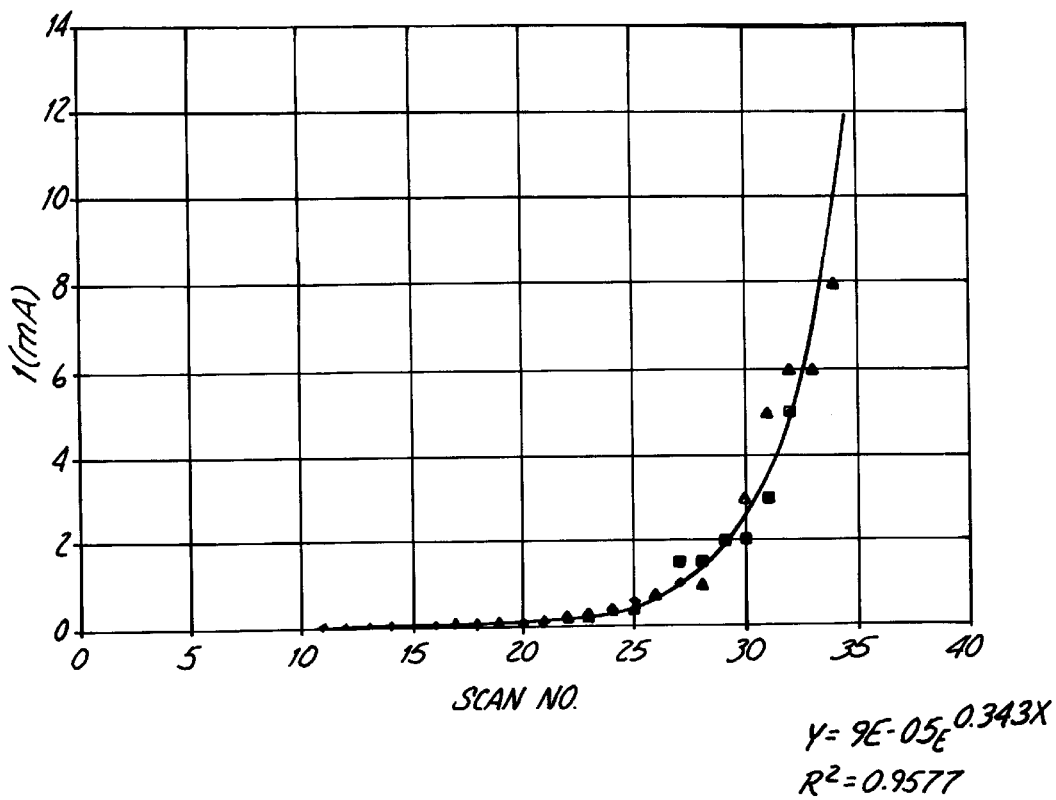
FIG. 3 shows a plot of a optical beam induced current signal measured from the active circuit on the flip chip as silicon is progressively removed from the back side of the flip chip.

Now turning to FIG. 3, it can be seen that the OBIC signal is a strong function of the amount of light reaching the junction. FIG. 3 shows a plot of an optical beam induced current signal measured from the active circuit on the flip chip as silicon is progressively removed from the back side 112 of the flip chip type die 100. FIG. 3 is a plot of current data measured across the pins 142 (VSS) and 140 (VDD) of the package. The plot represents data produced by scanning a laser over a 300×300 micron area in the presence of chlorine gas. About 1.8 microns of silicon was removed from the backside 112 of the die 100 by each scan. During each scan, when the laser was positioned in the middle of a trench associated with local thinning, the OBIC signal was measured across VDD and VSS. A laser having power of 4 W was used. The resulting OBIC signal was found to be strongly dependent on the remaining silicon thickness.

The plot of FIG. 3 can be mathematically described. The amount of light reaching the junction region is attenuated by absorption losses in silicon and is known to follow Beer's law. The attenuation is strongly dependent on the silicon thickness as follows:

$$I = I_0 \exp(-\alpha t)$$

Where I=the intensity of light, $I_0$=intensity of light incident on the back surface $\alpha$=absorption coefficient t=thickness of the absorbing medium With this technique, the thickness of the absorbing medium, namely the silicon between the backside 120 and the epitaxial layer 112, can be monitored by observing the OBIC signal. Thus, the thickness of the remaining silicon during any removal process can be quantified. From this data it is clear that the OBIC signal can be monitored and used as an endpoint detection method for the removal of silicon using any type of removal process. By monitoring the OBIC signal, the removal of silicon can be stopped at desired thickness associated with the strength of the OBIC signal.

The absorption coefficient $\alpha$, is dependent on the type of material and the wavelength of light used. The OBIC signal strength is directly proportional to the amount of light reaching the junction area or the attenuated light intensity. Hence, OBIC is a function of the incident light intensity and the silicon thickness while the other parameters, absorption coefficient and light wavelength are fixed. If the starting silicon thickness is $t_0$, the OBIC signal S can be modeled as:

$$S = A \exp(-\alpha(t_0 - t_r))$$

where $t_r$ is the thickness of silicon removed and A is a proportionality constant. Note that, in the above equation, $(t_0 - t_r)$ is the thickness of remaining silicon. The above relation for OBIC signal I can also be written as:

$$S = B \exp(\alpha t_r).$$

For endpoint monitoring of silicon thickness, it is imperative that we predetermine the OBIC signal corresponding to the remaining silicon thickness. This can be referred to as a calibration scheme. For a light source of preset light intensity, and type of IC made using a given process technology, OBIC signal is monitored while backside silicon is removed in known amounts. Then the dice is cross-sectioned to determine the remaining silicon thickness corresponding to the OBIC signal observed.

Figure 4:
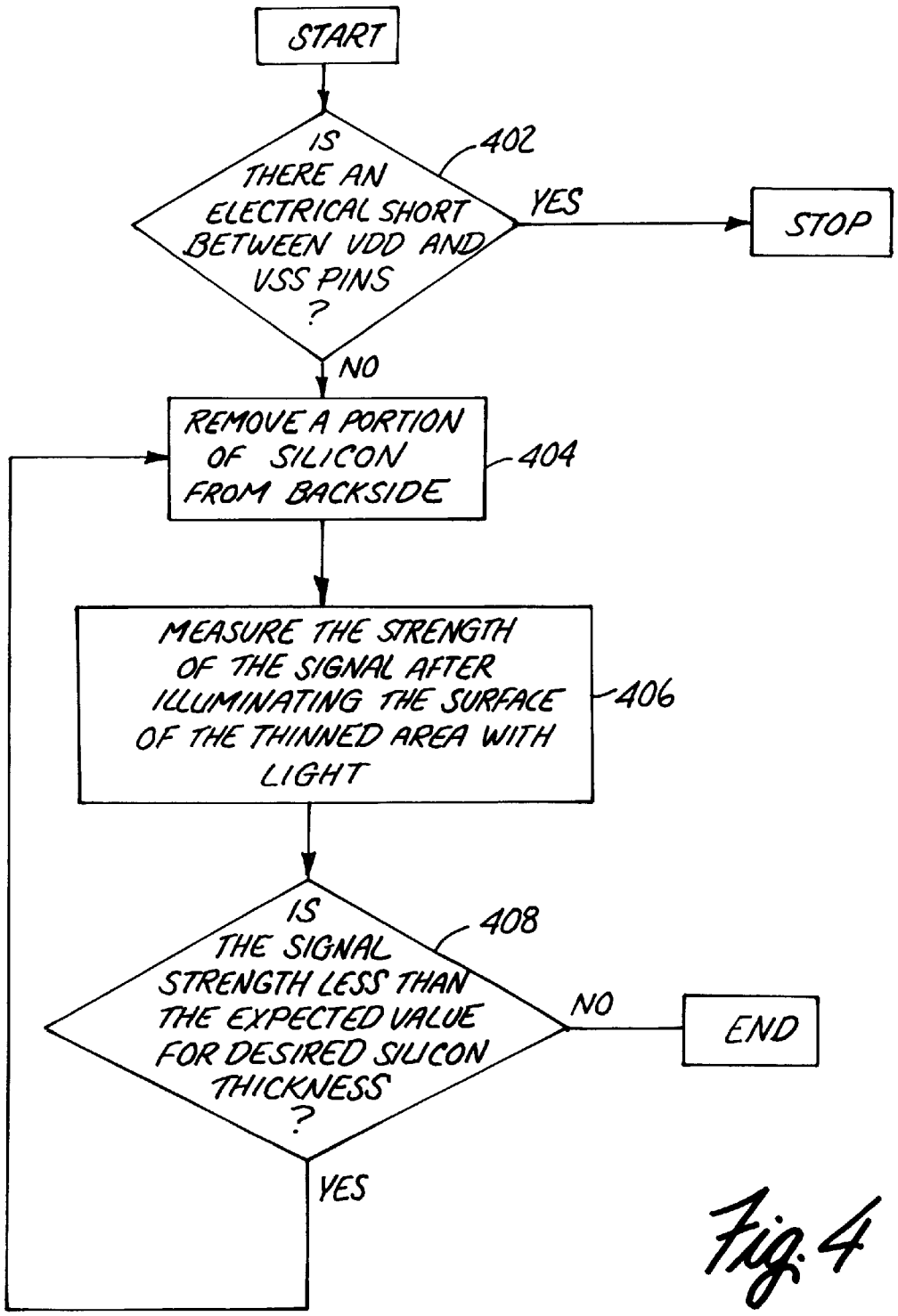
FIG. 4 is a flow diagram of the method for monitoring the OBIC signal for detection of the endpoint of the silicon removal.

FIG. 4 is a flow diagram of the method for monitoring the OBIC signal for detection of endpoint for silicon removal. The first step, depicted by reference number 402, is to check for shorting between VDD and VSS pins. If there is no electrical short (Resistance, measured while applying a voltage of less than 0.1 V, between the pins VDD and VSS>100 Ohms) between the pins, a portion of silicon from backside is removed, as depicted by step 404, and then the signal induced due to light exposure is checked again, as depicted by step 406. The steps of silicon removal 404 and measuring induced current 406 are repeated until the signal strength of the induced signal corresponds to the signal for desired silicon thickness as depicted by reference number 408.

Figure 5:
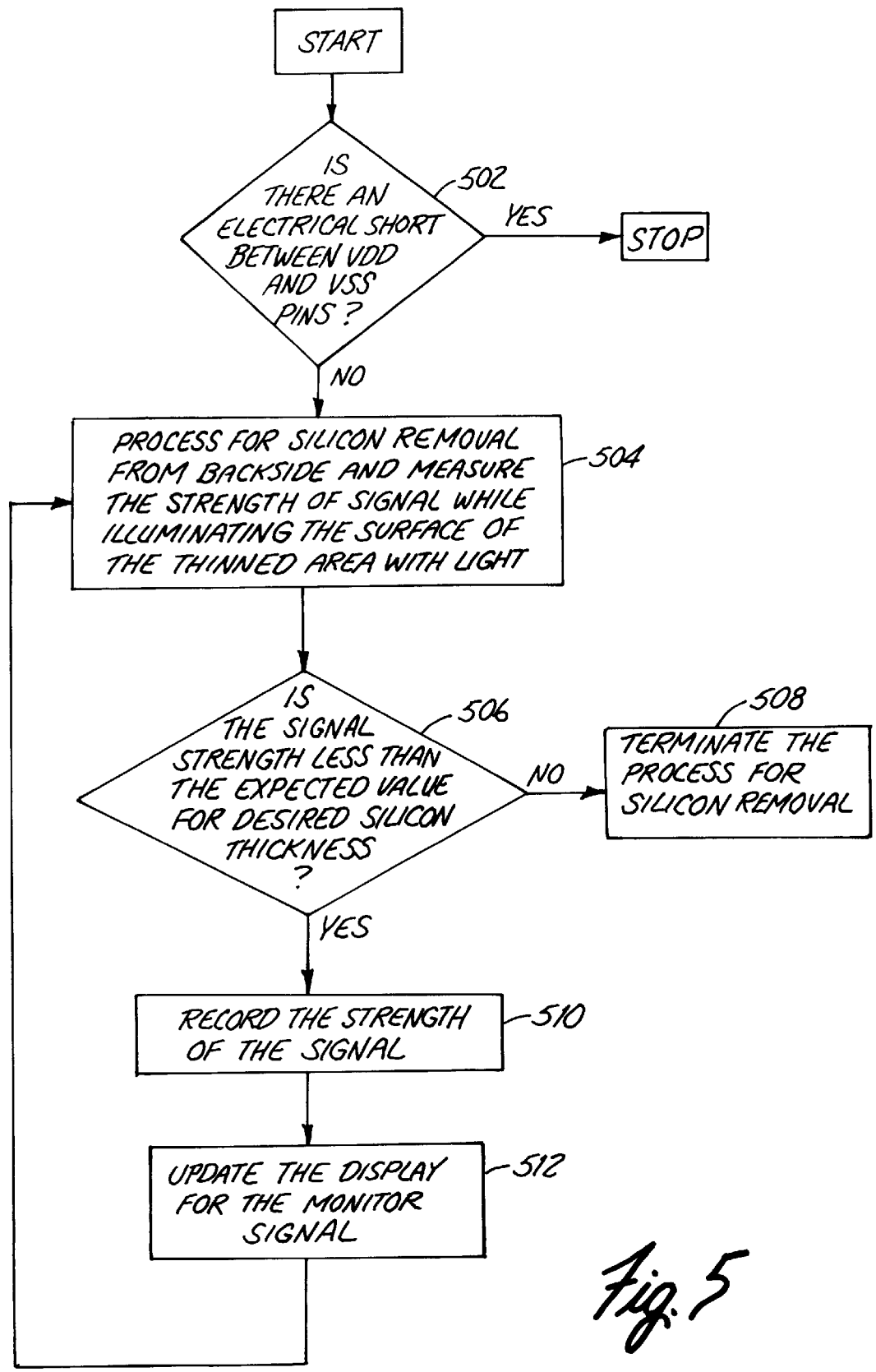
FIG. 5 is a flow diagram for in-process monitoring of the OBIC signal for detection of endpoint for silicon removal.

FIG. 5 is a flow diagram of the method for in-process monitoring of the OBIC signal for detection of endpoint for silicon removal. The first step, depicted by reference number 502, is to check for shorting between VDD and GND pins. If there is no electrical short (Resistance, measured while applying a voltage of less than 0.1 V, between the pins VDD and VSS>100 Ohms) between the pins, the part is used for backside thinning of silicon. As the backside of silicon is thinned, light is exposed to the area being thinned and the induced signal is measured as depicted by step 504. The next step 506 is to make a decision with respect to whether the signal strength is less than the expected value for the desired thickness. If the signal strength is equal to or greater than the signal strength associated with the desired thickness, the process is terminated, as depicted by number 508. If the signal strength is less than the signal strength associated with the desired thickness, the process is continued. The signal is rerouted to step 504 where the silicon is removed while as the backside is illuminated and the strength of the signal is monitored. The signal strength is recorded, as depicted by reference number 510. The signal may be used to update the display as depicted by reference number 512. When the induced signal reaches the strength associated with the desired thickness of remaining silicon, terminate the thinning process. This way, closed-loop process control is achieved. It should be noted that if the silicon removal process is a laser-based process using a laser wavelength<1.1 microns, then the same process laser may be used as the light source for OBIC signal.

Figure 6:
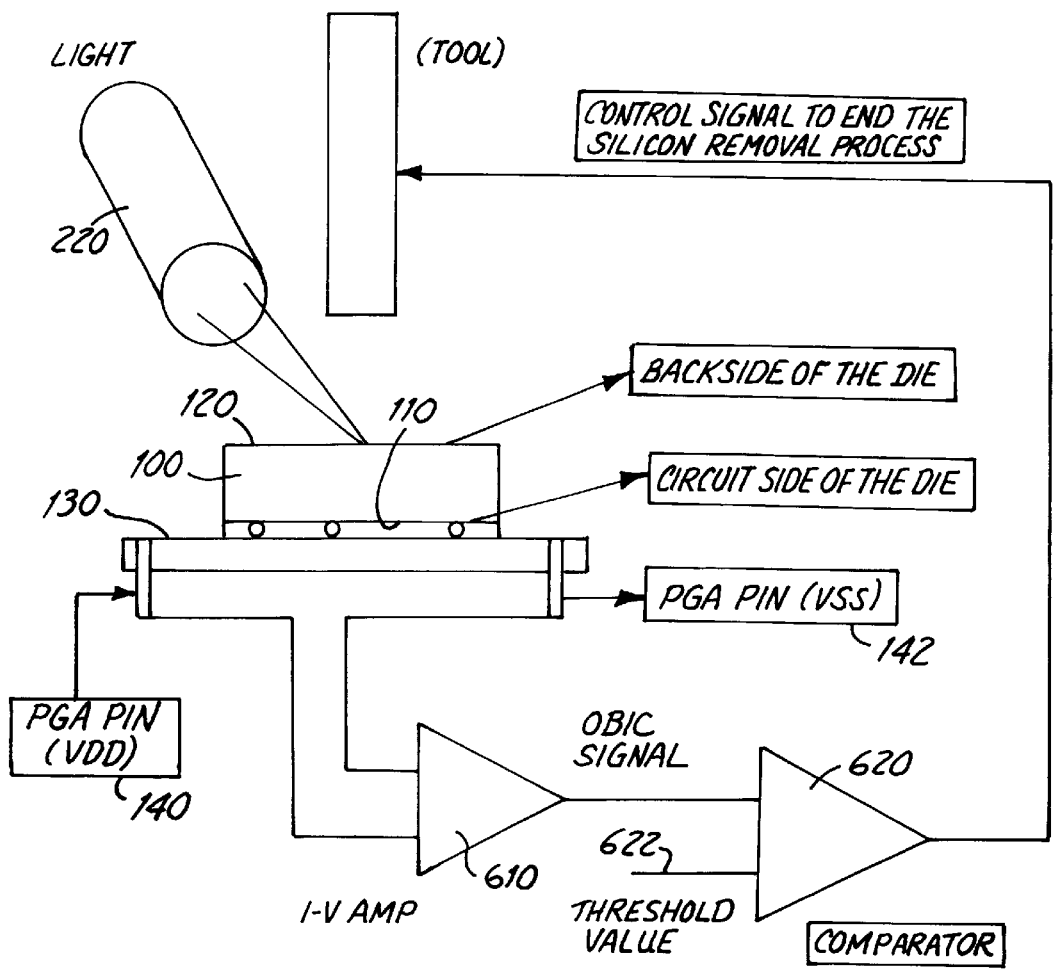
FIG. 6 is a schematic implementation of the system for closed loop control for silicon removal.

FIG. 6 is an electronic schematic implementation of the apparatus or system 600 used for carrying out the process discussed with respect to FIG. 5. The system 600 is similar to the system 200 for determining the distance to the active circuit of a flip chip type die 100. Common components of the system 600 will carry the same reference numbers. The light source 220 which can be a broad spectrum type of light which produces a range of light frequencies or can be a laser which generally produces one wavelength of light. In other words, the light source 220 can be broad beam and include many different wavelengths of light or the light source can be monochromatic which produces light having a single wavelength. The light source 220 is constantly directed at the backside 120 surface of the die 100 when the distance to the circuitry is desired. The system 600 for determining the distance to the active circuit of a flip chip type die 100 attached to a substrate or surface 130 also includes a transimpedance amplifier, 610 for measuring electrical current between the pins VSS 142 and VDD 140. The strength of the output at the pins 140 and 142 is indicative of the distance between the circuitry or devices found in the epitaxial layer near the circuit side 110 of the die 100 and the backside 120 of the die 100. The output from the amplifier 610 is input to a comparator 620. The comparator 620 compares the signal output from the transimpedance amplifier 610 to a selected value, also called the threshold value, which is also input to the comparator on line 622. When the output from the transimpedance amplifier 610 equals the threshold value on line 622, a control signal 630 is output to the silicon removal tool 210. The control signal 630 stops the removal tool 210 from removing additional silicon from the backside 120 of the flip chip 100.

It should be noted that this method will also work with other types of induced current. It should also be noted that this technique is not limited to use with silicon material nor is it limited to the field of semiconductors. This method could be used in other industries and with other materials.

Advantageously, the inventive method is well-suited for control by an information handling system 700, such as computer or microprocessor. A generalized information handling system 700 is shown in FIG. 7. The information handling system 700 includes a central processing unit 704, a random access memory 732, and a system bus 730 for communicatively coupling the central processing unit 704 and the random access memory 732. The system 700 may also include an input/output bus 710 and several devices peripheral devices, such as 712, 714, 716, 718, 720, and 722 may be attached to the input output bus 710. Peripheral devices may include hard disk drives, floppy disk drives, monitors, keyboards and other such peripherals. The information handling system 700 can be programmed to carry out the steps shown in FIGS. 4 and 5. The programmed process steps can be placed on any medium, such as the INTERNET, a tape drive, a floppy drive or a hard drive for use by the information handling system. The steps can also be distributed for use on other information handling systems using similar media.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for evaluating a thickness of material between a selected area at the backside of a die and a region in the die, the method comprising:

directing light toward the backside of the die; and measuring an electrical output of the semiconductor device that is responsive to the directed light and, therefrom, evaluating the thickness of the material.

2. The method of claim 1 wherein evaluating the thickness of the material includes correlating the electrical output to the thickness of the material between the selected area at the backside of the die and the region in the die.

3. The method of claim 1 wherein the step of measuring the electrical output of the semiconductor device includes measuring a signal across the VDD and VSS pins of the semiconductor device.

4. The method of claim 1 wherein the step of directing light toward the backside of the die includes removing a portion of material between the region in the die and the selected area at the backside of the die.

5. The method of claim 1 further comprising the steps of:

removing a portion of material between the region in the die and the selected area at the backside; and directing light toward the backside of the die to determine the thickness.

6. The method of claim 5, wherein removing is controlled at a rate and further comprising varying the rate at which material is removed from the backside of the die.

7. The method of claim 6 further comprising the step of varying the rate at which material is removed from the backside of the die under feedback loop control.

8. The method of claim 5 further comprising slowing the rate at which material is removed as the thickness of the material between the region in the die and the selected area at the backside of the die lessens.

9. A device for use on a die which includes circuitry, said die having a circuit side and a backside, said device comprising:

a tool for removing material between a selected area at the backside of the die and a region in the die;

a source of light directed toward the backside of the die; and a signal measuring device for measuring a signal produced in response to the circuitry in the die being exposed to photons from the light source.

10. The device of claim 9 further comprising an information handling system for controlling the removal of material between the selected area and the region in the die.

11. The device of claim 9 wherein the light source is broad beam.

12. The device of claim 9 wherein the light source is monochromatic.

13. The device of claim 12 wherein the light source is a laser.

14. The device of claim 9, wherein the die includes at least one semiconductor device formed in an epitaxial layer of the die, and the device further comprising an optics tool adapted to view the at least one semiconductor device.

15. The device of claim 14 wherein the optics tool uses infrared microscopy.

16. A device for use on a die which includes circuitry, said die having a circuit side and a backside, said device comprising:

a tool for removing material between a selected area at the backside of the die and a region in the die;

a light source directed toward the backside of the die; and a signal measuring device for measuring a signal induced in the circuitry in response to exposing the die to the light source.

17. The device of claim 16 further comprising an information handling system for controlling the removal of material between the selected area and the region in the die.

18. The device of claim 16 wherein the tool is adapted to operate by:

globally thinning material on substantially the entire area of the backside of the die; and locally thinning material on a portion of the area associated with the backside.

19. The device of claim 16, wherein the die includes at least one semiconductor device formed in an epitaxial layer of the die, further comprising a mechanism for viewing the at least one semiconductor device.

20. A method for removing substrate from a semiconductor die having circuitry in a circuit side opposite a back side, the method comprising:

removing a portion of the substrate in the die and forming an exposed region;

directing light toward the exposed region and generating optical beam induced current (OBIC) in the circuitry;

detecting an electrical output of the circuitry and evaluating therefrom a thickness of substrate between a region in the die and the exposed region; and responsive to the evaluated thickness, controlling the substrate removal process.

21. A method according to claim 20, wherein removing a portion of the substrate in the die and forming an exposed region includes removing a portion of substrate from the circuit side of the die.

22. A method according to claim 20, wherein the step of removing a portion of the substrate and the step of directing light are performed in a single step including etching the substrate with a laser etching device.

23. A method according to claim 20, wherein removing a portion of the substrate includes laser etching, and wherein directing light toward the exposed region includes directing a secondary light source toward the exposed region.

24. A method according to claim 20, wherein the secondary light source includes a laser light source.

25. A method according to claim 20, wherein controlling the substrate removal process comprises controlling the substrate removal rate as a function of the evaluated thickness of the substrate.

26. A method according to claim 25, wherein controlling the substrate removal rate as a function of the evaluated thickness of the substrate includes terminating the substrate removal rate responsive to determining a thickness corresponding to an endpoint of the substrate removal process.

27. A method according to claim 25, wherein controlling the substrate removal rate as a function of the evaluated thickness of the substrate includes adjusting the substrate removal rate responsive to reaching a first thickness threshold defined as a function of the semiconductor die and the substrate removal process.

28. A method according to claim 27, wherein adjusting the substrate removal rate includes reducing the substrate removal rate responsive to approaching the endpoint of the substrate removal process.

29. A method according to claim 20, wherein removing a portion of the substrate in the die and forming an exposed region includes removing a portion of substrate from the back side of the die.

* * * * *

UNITED STATES PATENT AND TRADEMARK OFFICE
CERTIFICATE OF CORRECTION

PATENT NO. : 6,069,366

DATED : May 30, 2000

INVENTOR(S) : Goruganthu et al.

It is certified that error appears in the above-identified patent and that said Letters Patent is hereby corrected as shown below:

Col. 5, line 39: "porions" should read --portions--.

Signed and Sealed this

Twenty-fourth Day of April, 2001

Attest:

NICHOLAS P. GODICI

*Attesting Officer*   *Acting Director of the United States Patent and Trademark Office*

UNITED STATES PATENT AND TRADEMARK OFFICE
CERTIFICATE OF CORRECTION

PATENT NO. : 6,069,366
DATED : May 30, 2000
INVENTOR(S) : Goruganthu et al.

It is certified that error appears in the above-identified patent and that said Letters Patent is hereby corrected as shown below:

Column 5,
Line 39, "porions" should read -- portions --.

Signed and Sealed this

Ninth Day of October, 2001

*Attest:*

NICHOLAS P. GODICI
*Attesting Officer*     *Acting Director of the United States Patent and Trademark Office*